(12) United States Patent
Skunes

(10) Patent No.: US 6,538,244 B1
(45) Date of Patent: Mar. 25, 2003

(54) PICK AND PLACE MACHINE WITH IMPROVED VISION SYSTEM INCLUDING A LINESCAN SENSOR

(75) Inventor: Timothy A. Skunes, Mahtomedi, MN (US)

(73) Assignee: CyberOptics Corporation, Golden Valley, MN (US)

(*) Notice: Subject to any disclaimer, the term of this patent is extended or adjusted under 35 U.S.C. 154(b) by 0 days.

(21) Appl. No.: 09/524,071

(22) Filed: Mar. 13, 2000

Related U.S. Application Data

(63) Continuation-in-part of application No. 09/434,325, filed on Nov. 4, 1999, and a continuation-in-part of application No. 09/434,320, filed on Nov. 4, 1999, and a continuation-in-part of application No. 09/432,552, filed on Nov. 3, 1999.

(51) Int. Cl.⁷ .............................................. H01L 27/00
(52) U.S. Cl. .......................... 250/208.1; 250/559.34; 348/87; 348/95
(58) Field of Search ...................... 250/208.1, 559.29, 250/559.32, 559.34; 382/151; 348/87, 94, 95; 356/394, 237.1, 614, 622

(56) References Cited

U.S. PATENT DOCUMENTS

| | | |
|---|---|---|
| 4,473,842 A | 9/1984 | Suzuki et al. ............... 358/107 |
| 4,521,112 A | 6/1985 | Kuwabara et al. .......... 356/375 |
| 4,578,810 A | 3/1986 | MacFarlane et al. .......... 382/8 |
| 4,615,093 A | 10/1986 | Tews et al. .................... 29/407 |
| 4,675,993 A | 6/1987 | Harada ......................... 29/740 |
| 4,700,398 A | 10/1987 | Mizuno et al. ................. 382/1 |
| 4,706,379 A | 11/1987 | Seno et al. .................... 29/740 |
| 4,727,471 A | 2/1988 | Driels et al. ................. 364/167 |
| 4,738,025 A | 4/1988 | Arnold ......................... 29/834 |
| 4,743,768 A | 5/1988 | Watannabe .................. 250/556 |
| 4,772,125 A | 9/1988 | Yoshimura et al. ......... 356/237 |
| 4,782,273 A | 11/1988 | Moynagh .................... 318/568 |
| 4,794,689 A | 1/1989 | Seno et al. .................... 29/740 |
| 4,811,410 A | 3/1989 | Amir et al. ...................... 382/8 |
| 4,875,778 A | 10/1989 | Luebbe et al. .............. 356/394 |
| 4,876,728 A | 10/1989 | Roth ............................. 382/21 |

(List continued on next page.)

FOREIGN PATENT DOCUMENTS

| | | |
|---|---|---|
| DE | 198 26 555 A1 | 12/1999 |
| EP | 0 664 666 A1 | 1/1994 |
| EP | 0 942 641 A2 | 9/1997 |

(List continued on next page.)

OTHER PUBLICATIONS

Copy of International Search Report from Application No. PCT/US01/11629 with international filing date of Apr. 4, 2001.

(List continued on next page.)

Primary Examiner—Stephone Allen
Assistant Examiner—Eric J Spears
(74) Attorney, Agent, or Firm—Westman, Champlin & Kelly, P.A.

(57) ABSTRACT

A pick and place machine is disclosed which includes an on-head linescan sensor, and at least one additional optical sensor. The at least one additional sensor can be an off-head linescan sensor, an off-head or on-head 2D camera, an on-head shadow (e.g. one which shadows or images the profile of a component onto a detector, such as a LaserAlign®) sensor, an off-head or on-head coplanarity sensor, or an on-head or off-head fiducial camera. The additional optical sensor is disposed to provide essential placement information in the form of orientation information or inspection information. Combinations of the aforementioned additional sensor can also be used in embodiments of the present invention of the pick-and-place machine. The present invention is particularly useful with multi-head component placement machines, although it is usable with single head machines as well.

18 Claims, 9 Drawing Sheets

U.S. PATENT DOCUMENTS

| | | | |
|---|---|---|---|
| 4,920,429 A | 4/1990 | Jaffe et al. .................. 358/471 |
| 4,942,618 A | 7/1990 | Sumi et al. ..................... 382/8 |
| 4,959,898 A | 10/1990 | Landman et al. ............. 29/705 |
| 4,969,108 A | 11/1990 | Webb et al. ................. 364/513 |
| 4,973,216 A | 11/1990 | Domm ..................... 414/744.5 |
| 4,980,971 A | 1/1991 | Bartschat et al. ............. 29/833 |
| 5,030,008 A | 7/1991 | Scott et al. ................. 356/394 |
| 5,046,113 A | 9/1991 | Hoki ............................. 382/8 |
| 5,084,959 A | 2/1992 | Ando et al. .................. 29/740 |
| 5,084,962 A | 2/1992 | Takahashi et al. ............ 29/833 |
| 5,086,559 A | 2/1992 | Akatsuchi .................... 29/834 |
| 5,096,353 A | 3/1992 | Tesh et al. .................. 414/225 |
| 5,099,522 A | 3/1992 | Morimoto ...................... 382/8 |
| 5,140,643 A | 8/1992 | Izumi et al. .................... 382/8 |
| 5,148,591 A | 9/1992 | Pryor .......................... 29/407 |
| 5,195,234 A | 3/1993 | Pine et al. .................... 29/720 |
| 5,208,463 A | 5/1993 | Honma et al. .............. 250/561 |
| 5,233,745 A | 8/1993 | Morita ........................ 29/705 |
| 5,237,622 A | 8/1993 | Howell .......................... 382/8 |
| 5,249,239 A | 9/1993 | Kida ............................. 382/8 |
| 5,249,349 A | 10/1993 | Kuinose et al. .............. 29/721 |
| 5,278,634 A | 1/1994 | Skunes et al. .............. 356/400 |
| 5,309,522 A | 5/1994 | Dye ............................ 382/41 |
| 5,331,406 A * | 7/1994 | Fishbaine et al. ........... 382/147 |
| 5,342,460 A | 8/1994 | Hidese ......................... 156/64 |
| 5,369,492 A | 11/1994 | Sugawara ................... 356/394 |
| 5,377,405 A | 1/1995 | Sakurai et al. ................ 29/833 |
| 5,379,514 A | 1/1995 | Okuda et al. ................. 29/833 |
| 5,383,270 A | 1/1995 | Iwatsuka et al. .............. 29/840 |
| 5,403,140 A | 4/1995 | Carmichael et al. ........ 414/280 |
| 5,434,629 A | 7/1995 | Pearson et al. ............. 348/721 |
| 5,452,370 A | 9/1995 | Nagata ........................ 382/153 |
| 5,456,003 A | 10/1995 | Yamamoto et al. ........... 29/840 |
| 5,461,480 A | 10/1995 | Yamada et al. ............. 356/394 |
| 5,491,888 A | 2/1996 | Sakurai et al. ................ 29/832 |
| 5,523,663 A | 6/1996 | Tsuge et al. ........... 318/568.16 |
| 5,541,834 A | 7/1996 | Tomigashi et al. ..... 364/167.01 |
| 5,555,090 A | 9/1996 | Schmutz .................... 356/381 |
| 5,559,727 A | 9/1996 | Deley et al. ................. 364/559 |
| 5,560,100 A | 10/1996 | Englert ........................ 29/833 |
| 5,566,447 A | 10/1996 | Sakurai ...................... 295/832 |
| 5,592,563 A | 1/1997 | Zahavi ....................... 382/154 |
| 5,608,642 A * | 3/1997 | Onedera ..................... 700/231 |
| 5,619,328 A * | 4/1997 | Sakurai ...................... 356/621 |
| 5,660,519 A | 8/1997 | Ohta et al. .................. 414/783 |
| 5,661,561 A | 8/1997 | Wurz et al. ................. 356/386 |
| 5,671,527 A | 9/1997 | Asai et al. .................... 29/740 |
| 5,694,219 A | 12/1997 | Kim ........................... 356/375 |
| 5,724,722 A | 3/1998 | Hashimoto ................... 29/740 |
| 5,739,846 A * | 4/1998 | Gieskes ........................ 348/87 |
| 5,743,005 A * | 4/1998 | Nakao et al. .................. 29/833 |
| 5,768,759 A * | 6/1998 | Hudson ................... 29/407.04 |
| 5,777,746 A | 7/1998 | Dlugos ....................... 356/380 |
| 5,787,577 A | 8/1998 | Kent ............................. 29/833 |
| 5,832,107 A | 11/1998 | Choate ....................... 382/154 |
| 5,839,186 A | 11/1998 | Onodera ...................... 29/740 |
| 5,855,059 A | 1/1999 | Togami et al. .............. 297/740 |
| 5,864,944 A | 2/1999 | Kashiwagi et al. ........... 29/833 |
| 5,878,484 A | 3/1999 | Araya et al. .................. 29/740 |
| 5,999,266 A | 12/1999 | Takahashi et al. .......... 356/376 |
| 5,999,640 A | 12/1999 | Hatase et al. ............... 382/151 |
| 6,018,865 A | 2/2000 | Michael ....................... 29/740 |
| 6,031,242 A | 2/2000 | Hudson ....................... 250/548 |
| 6,118,538 A | 9/2000 | Haugan et al. .............. 356/375 |
| 6,195,165 B1 | 2/2001 | Sayegh ....................... 356/376 |
| 6,232,724 B1 | 5/2001 | Onimoto et al. ............. 315/161 |
| 6,243,164 B1 | 6/2001 | Baldwin et al. ............. 356/375 |
| 6,291,816 B1 | 9/2001 | Liu ............................. 250/234 |
| 6,292,261 B1 * | 9/2001 | Fishbaine et al. ........... 356/375 |
| 6,342,916 B1 | 1/2002 | Kashiwagi et al. ........... 348/87 |

FOREIGN PATENT DOCUMENTS

| | | |
|---|---|---|
| EP | 0 854 671 A1 | 7/1998 |
| EP | 0 730 397 B1 | 4/1999 |
| JP | 2-18900 | 7/1990 |
| JP | 2-275700 | 11/1990 |
| JP | 2-306700 | 12/1990 |
| JP | 3-030499 | 2/1991 |
| JP | 3-110898 | 5/1991 |
| JP | 3-265198 | 11/1991 |
| JP | 3-117898 | 12/1991 |
| JP | 3-289197 | 12/1991 |
| JP | 3-293800 | 12/1991 |
| JP | 3-104300 | 2/1992 |
| JP | 4-051598 | 2/1992 |
| JP | 4-064292 | 2/1992 |
| JP | 4-083400 | 3/1992 |
| JP | 4-107988 | 4/1992 |
| JP | 4-107993 | 4/1992 |
| JP | 4-262201 | 9/1992 |
| JP | 4-271200 | 9/1992 |
| JP | 4-311100 | 11/1992 |
| JP | 5-053360 | 7/1993 |
| JP | 5-335793 | 12/1993 |
| JP | 7-020960 | 8/1994 |
| JP | 6-291490 | 10/1994 |
| JP | 6-310899 | 11/1994 |
| JP | 7-336099 | 12/1995 |
| JP | 8-005335 | 1/1996 |
| JP | 8-018289 | 1/1996 |
| JP | 8-032299 | 2/1996 |
| JP | 8-043025 | 2/1996 |
| JP | 8-046396 | 2/1996 |
| JP | 8-167799 | 6/1996 |
| JP | 2554424 | 8/1996 |
| JP | 2554437 | 8/1996 |
| JP | 9-023097 | 1/1997 |
| JP | 9-246799 | 9/1997 |
| JP | 9-293998 | 11/1997 |
| JP | 9-307286 | 11/1997 |
| JP | 9-307297 | 11/1997 |
| JP | 2847801 B2 | 1/1999 |
| JP | 2000-312100 | 7/2000 |
| JP | 2000-299600 | 10/2000 |
| JP | P3186387 | 7/2001 |
| WO | WO 99/42257 | 8/1999 |
| WO | WO 00/26611 | 5/2000 |

OTHER PUBLICATIONS

"A Stereo Imagining System for Dimensional Measurement," by Robert C. Chang, SPI, vol. 2909, pp. 50–57 (undated).

"A New Sense for Depth of Field," by A. Pentland, IEEE Trans. Pattern Anal. Machine Intell. 9, pp. 523–531 (1987).

"Application of Modulation Measurement Profilometry to Objects With Surface Holes," by Likun et al., Applied Optics, vol. 38, N0. 7, pp. 1153–1158.

"A Matrix Based Method for Determining Depth From Focus," by J. Ens and P. Lawrence, in Proceedings of IEEE Conference on Computer Vision and Pattern Recognition (Institute of Electrical and Electronics Engineers, New Your, pp. 600–609 (1991).

"Library of C/C++ Machine Vision Software Routines," Imagining Technology, pp. 63–68 (1999).

"A Perspective on Range Finding Technique for Compute Vision," by R.A. Jarvis, IEEE Trans. Pattern Anal. Machine Intell. 5, pp. 122–139 (1983).

"Real Time Computation of Depth from DeFocus," by Watanabe et al., SPIE, vol. 2599, pp. 14–25 (undated).

"Root–Mean Square Error in Passive Autofocusing and 3D Shape Recovery," by Subbarao et al., SPIE, vol. 2909, pp. 162–177 (undated).

"Pyramid Based Depth from Focus," by T. Darrel and K. Wohn, in Proceedings of IEEE Conference on Computer Vision and Pattern Recognition (Institute of Electrical and Electronics Engineers, New York), pp. 504–509 (1988).

"SP–11–XXX40 Compact Line Scan Camera," downloaded from ww.dalsa.com, pp. 1–6 (undated).

U.S. patent application Ser. No. 09/432,552, Case et al., filed Nov. 3, 1999, Pending.

U.S. patent application Ser. No. 09/434,320, Skunes, filed Nov. 4, 1999, Pending.

U.S. patent application Ser. No. 09/434,325, Case, filed Nov. 4, 1999, Pending.

U.S. patent application Ser. No. 09/589,020, Skunes et al., filed Jun. 7, 2000, Pending.

* cited by examiner

PICK AND PLACE MACHINE WITH IMPROVED VISION SYSTEM INCLUDING A LINESCAN SENSOR

CROSS-REFERENCE TO RELATED APPLICATIONS

This is a continuation-in-part application of co-pending U.S. patent application Ser. No. 09/432,552 filed Nov. 3, 1999 entitled ELECTRONICS APPARATUS WITH IMPROVED IMAGING SYSTEM; Ser. No. 09/434,320 filed Nov. 4, 1999 entitled ELECTRONICS ASSEMBLY APPARATUS WITH HEIGHT SENSING SENSOR; and Ser. No. 09/434,325 filed Nov. 4, 1999 filed ELECTRONICS ASSEMBLY APPARATUS WITH STEREO VISION LINESCAN SENSOR, all owned by the same assignee as the present invention.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

The present invention relates to pick and place machines. More particularly, the present invention relates to an improved vision system for pick and place machines.

Pick and place machines are used by the electronics assembly industry to mount individual components on printed circuit boards. These machines automate the tedious process of placing individual electrical components on the circuit board. The machines generally pick up individual components from a component feeder or the like, and place the components in their respective positions on the circuit board.

In operation, it is generally necessary for the pick and place machine to review a given component prior to placement in order to adjust the orientation of the component for proper placement. A number of systems are known which allow the pick and place machine to review the component for the purpose of assessing its current orientation and computing an indication of how to adjust the orientation of the component in order to precisely place it on a PC board. Such systems generally fall within one of two categories.

The first type of system is known as an off-head system. These systems generally provide a fixed optical sensor, such as a two-dimensional (2-D) camera, that is located at a specific position relative to or within the pick and place machine. Once a component is picked up from the component feeder, it is typically moved to the location of the fixed optical sensor such that the orientation of the component can be computed from the image provided by the optical sensor.

The second type of system is known as on-head sensor system as described in U.S. Pat. No. 4,615,093 to Tewes. These systems, sometimes called "on-the-fly", have an optical sensor that is mounted to the component head of the pick and place machine. Thus, the optical sensor of the on-head system essentially rides with the component(s) from the component feeder to the desired mounting location(s). While travelling, the on-head sensor can image the components such that component orientations can be determined, and adjusted while the head is moving. Such systems provide a number of advantages over off-head systems. One such advantage is that precious assembly time is not sacrificed by moving the head to an off-head inspection location prior to mounting. Given that pick and place machines place a great number of components per hour, this time savings is significant.

One specific vision system, the on-head linescan sensor, provides significant advantages over various other systems. Such advantages include increased throughput, and manufacturing flexibility. On-head linescan sensors are mounted to, and travel with a placement head of the pick and place machine. Machines incorporating on-head linescan sensors are faster than off-head sensor systems since the head does not need to travel to a fixed inspection station to compute component orientation. Such machines are also very flexible due to the fact that they can directly image the electrical contacts of a wide array of components such as chip capacitors, flip-chips, Chip Scale Packages (CSPs), Ball Grid Arrays (BGAs), Quad Flat Packs (QFPs), and connectors. Additionally, since the linescan sensor scans line by line, the field of view is highly variable, and thus easily adaptable to many different applications. Further, since image resolution is related to sensor scan speed, image resolution can be varied as desired. Although on-head linescan sensors represent a significant improvement, pick and place machines employing such sensors do not provide the level of flexibility and placement efficiency that could be realized.

SUMMARY OF THE INVENTION

A pick and place machine is disclosed which includes an on-head linescan sensor, and at least one additional optical sensor. The linescan sensor provides component data, in the form of information for orienting the component or of quality-related information about the component. The at least one additional sensor can be an off-head linescan sensor, an off-head or on-head 2-D camera, an on-head shadow (e.g. one which shadows or images the profile of a component onto a detector, such as a LaserAlign®) sensor, an off-head or on-head coplanarity sensor, or an on-head or off-head fiducial camera. The additional optical sensor is disposed to provide essential placement information in the form of orientation information or inspection information. Combinations of the aforementioned additional sensor can also be used in embodiments of the present invention to the pick-and-place machine. The present invention is particularly useful with multi-head component placement machines, although it is usable with single head machines as well.

DETAILED DESCRIPTION OF THE PREFERRED EMBODIMENTS

Figure 1:
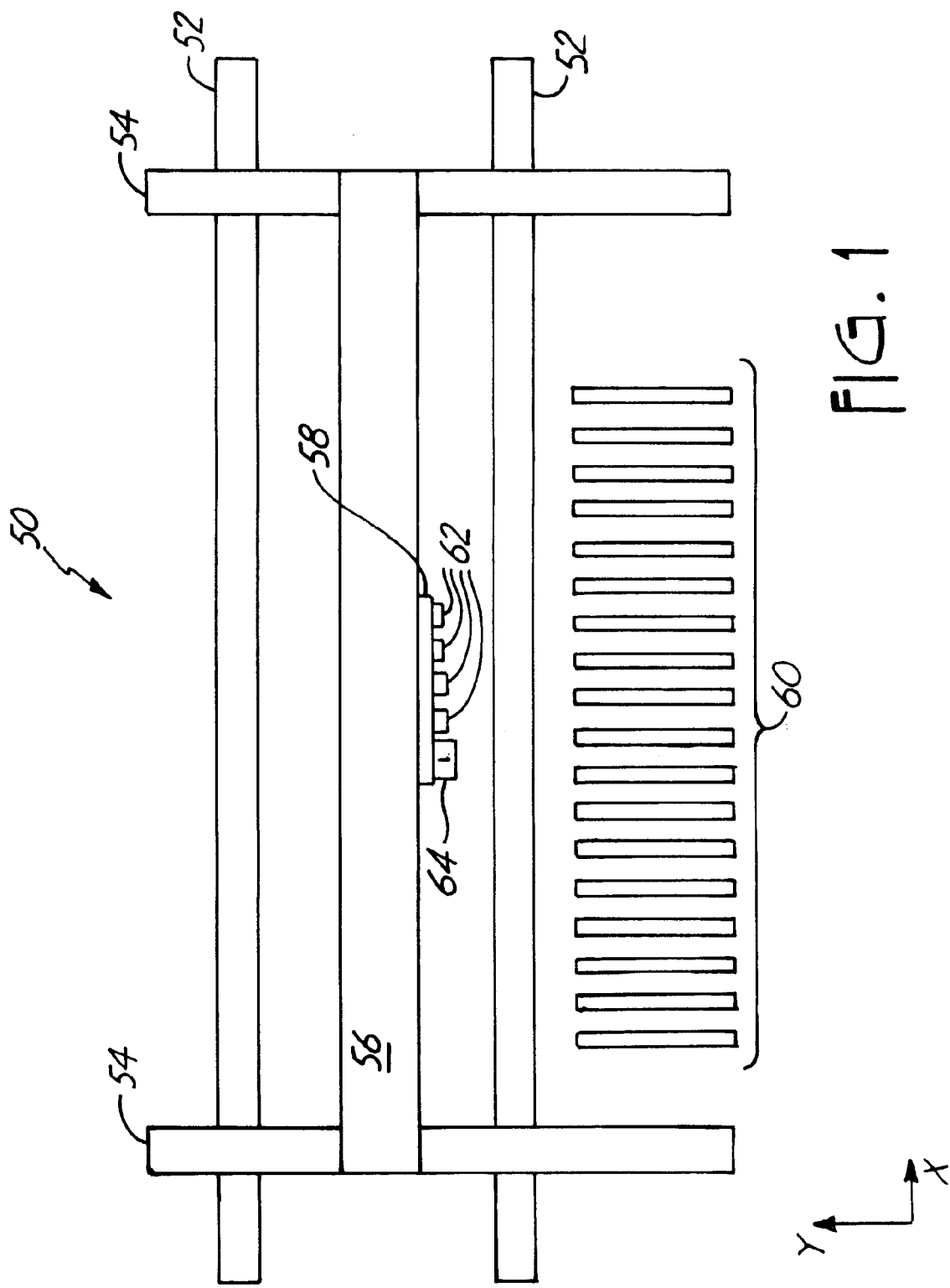
FIG. 1 is a top plan view of a pick and place machine.

FIG. 1 is a top plan view of pick and place machine 50, which includes conveyor 52, Y-axis gantry 54, X-axis gantry 56, placement head 58, and component feeders 60. Conveyor 52 transports a workpiece, such as a printed circuit board, underneath placement head 58. Placement head 58 then moves proximate component feeders 60, such that nozzles 62 of placement head 58 can acquire individual components from feeders 60. Once the components are picked up by nozzles 62, linescan sensor 64 is moved relative to the various components to image the component and then to determine the orientation of each component while travelling from feeders to workpiece. Any type of pick and place machine is contemplated for use with the on-head linescan sensor, the only requirement is that the on-head linescan sensor moves with the head, and the orientation measurement takes place at some point during transport to the workpiece. Individual component orientations are adjusted prior to mounting the components upon the workpiece. A more detailed description of the above operation is provided in the co-pending applications listed above, which is incorporated by reference, although the present invention is usable with various types of linescan sensors. In any event, the on-head linescan sensor of the present invention provides component data, in the form of information for orienting the component or of quality-related information about the component.

The speed, accuracy and flexibility of pick and place machines employing on-head linescan sensors can be improved with additional optical sensors, as will be apparent from the discussion of the various embodiments below. The present invention is particularly useful with multi-head component placement machines, although it is usable with single head machines as well.

Figure 2:
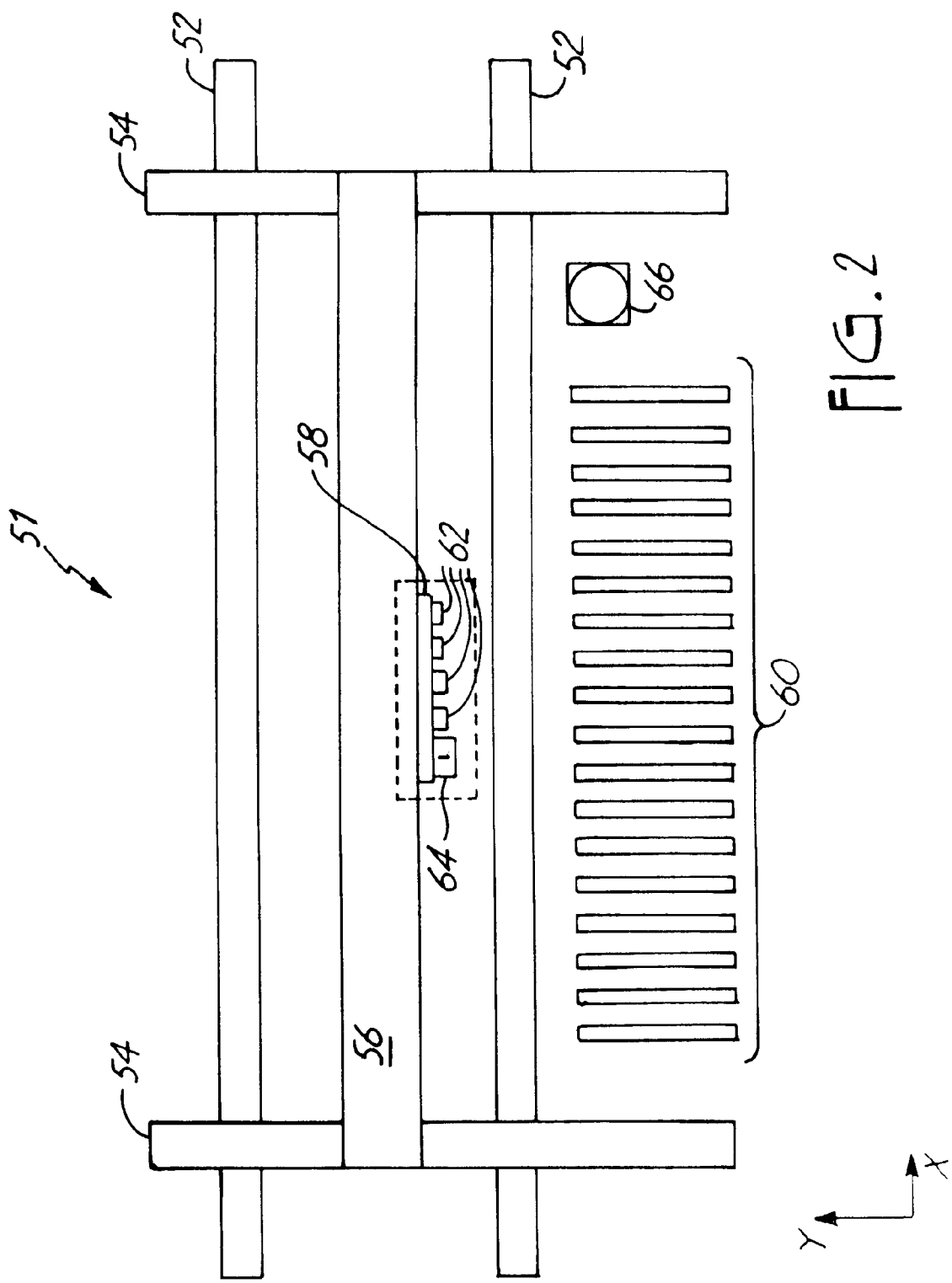
FIG. 2 is a top plan view of a pick and place machine in accordance with an embodiment of the present invention.

FIG. 2 is a top plan view of a pick and place machine in accordance with an embodiment of the present invention. Pick and place machine 51 is similar to machine 50 (shown in FIG. 1) and like components are numbered the same. The difference between machines 51 and 50 is the inclusion of off-head optical sensor 66 in pick and place machine 51. Off-head optical sensor 66 can be a fixed 2-D camera or an off-head linescan sensor.

Figure 3:
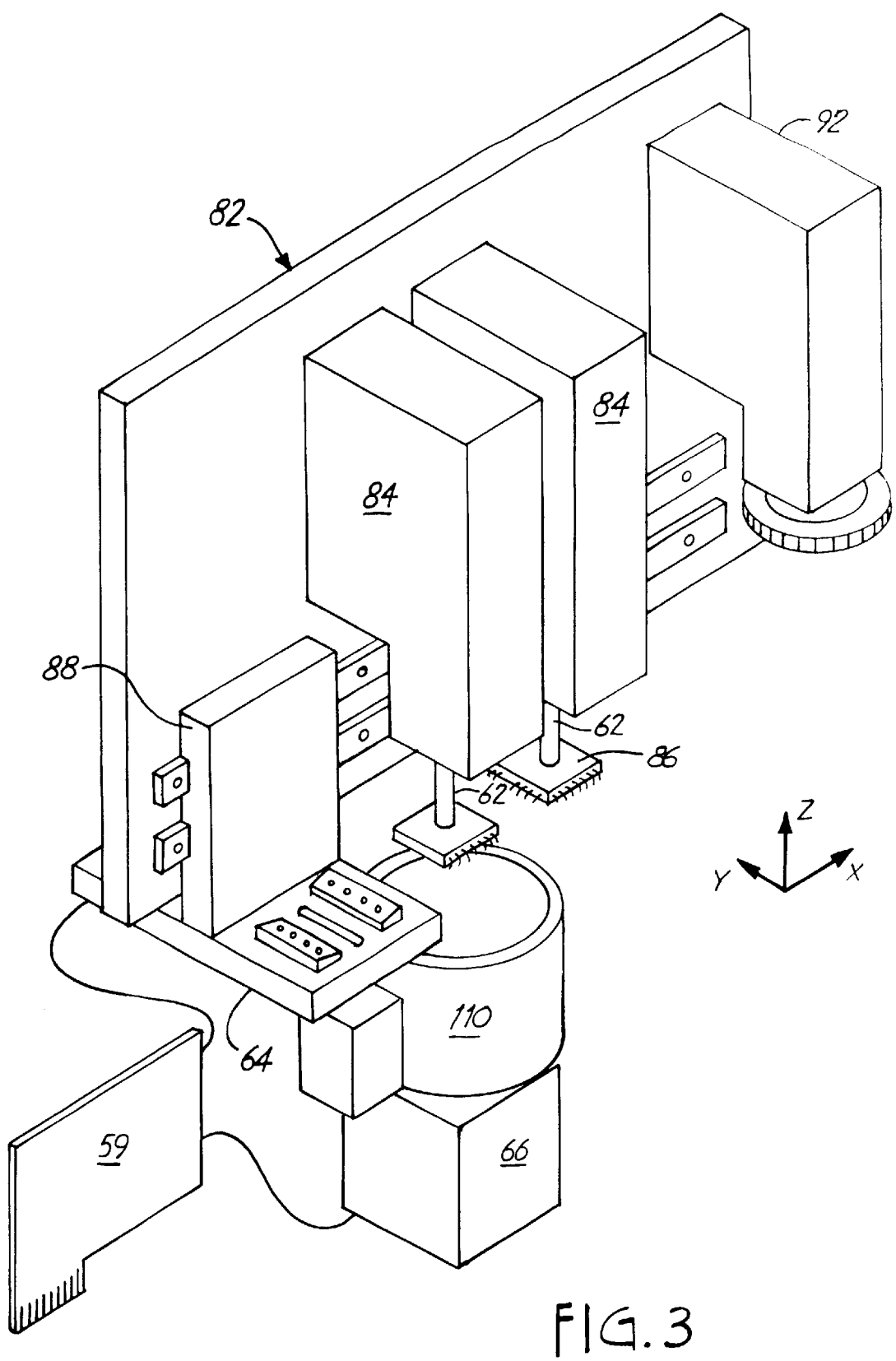
FIG. 3 is an isometric view of a portion of a pick and place machine in accordance with an embodiment of the present invention.

FIG. 3 is a side elevation view of a portion of another pick and place machine. Off-head optical sensor 66 is disposed below the nozzles 62 at a position spaced from the workpiece area. Thus, components held by any of nozzles 62 can be transported to off-head sensor 66 for additional analysis. FIG. 3 also illustrates controller 59 coupled to on-head linescan sensor 64 as well as off-head sensor 66. Controller 59 can be any device suitable for receiving data related to component placement, and directing a head 82 to appropriately place one or more components. Controller 59 is typically located in a card cage external to the pick and place machine, but may also be included within the electronics for such machine. Thus, controller 59 can be a computer, microprocessor, embedded controller, or any other suitable device. For clarity, controller 59 is not shown in the following figures, however, those skilled in the art will recognize that controller 59 is suitably coupled to the various sensors provided in the embodiments described below.

In one embodiment, off-head sensor 66 is a 2-D camera. This embodiment of the present invention is especially well suited for placement of small parts and only occasional placement of large parts. In particular, the on-head linescan sensor 64 is designed with certain width of its field of view, which width is set to be approximately equal to or slightly longer than the longest dimension of the small parts it will place. The fixed location 2-D camera 66 has a large field of view, which is set to be approximately equal to one dimension of the occasional large part it will view. When compared with a large field of view linescan sensor, the small field of view linescan sensor scans the part faster and with no loss of image resolution, since substantially all the pixels read from the small field of view linescan sensor show a portion of the small part. (In other instances when the linescan sensor's field of view is much greater than the part size, there will be pixels read out which show unnecessary background rather than the part.) The orientation of the large parts for this embodiment is measured by presenting them to the fixed-location 2-D camera 66 and orienting them accordingly. Large parts are typically the minority of parts on a board, and are typically the most costly and the most complex as well, resulting in an increased need for inspection information for these larger, complex parts.

In this embodiment, both linescan sensor 64 and fixed 2-D camera 66 are primarily used to provide essential placement information, although it is clear that inspection criteria, such as the pitch of leads in a PLCC or the presence/absence of balls on a BGA can be viewed and ascertained with either camera. The present invention (in the form of a pick-and-place machine having a linescan sensor with a small field of view and an off-head fixed array camera) has a faster average placement time (when the majority of components are measured with a high scanning velocity) when compared to a system with only a large field of view linescan sensor.

The addition of a fixed 2-D camera is not only able to reduce average placement times as described above, but also increase the accuracy of placing the components. For example, some placement machines are required to occasionally place components with very small features such as bare die (unpackaged substrates). The accuracy of these placements can be improved by using a fixed location, very high resolution 2-D camera (typically a 5 micron pixel size) to calculate the orientation and necessary adjustment of the bare die. The on-head linescan sensor 64 (typically a 13 micron pixel size) can then be used to place components with coarser features (e.g. PLCCs or QFPs with large pitch) in order to maintain high system throughout.

The flexibility of a pick and place machine is also improved by incorporating off-head optical sensor 66. For example, on-head linescan sensors are generally made as thin (i.e. narrow in the Z direction) as possible in order to reduce the nozzle up/nozzle down stroke during pick and placement. Thus, the thinner the linescan sensor, the faster the placement times and the better the system throughput. However, making the linescan sensor thin can sometimes compromise illuminator design. The illumination must be adequate to place components, but in some cases the illumination may not be adequate for high-precision inspection of component features. When a fixed off-head optical sensor is used, it can occupy significantly more physical space than the on-head linescan sensor, and as a result, off-head sensor 66 can be designed with optimized illumination head 110 to illuminate component features for high-precision inspection or high-precision orientation measurements.

In another embodiment, off-head sensor 66 is an off-head linescan sensor. The fixed linescan sensor is designed to have highly sophisticated illumination, very high resolution (e.g., 5 micron pixel size), and a large field of view (e.g., a 20 mm field of view). Thus, a placement machine with an on-head linescan sensor and an off-head, fixed, linescan sensor also provides enhanced flexibility, accuracy and speed when compared to a pick and place machine having an on-head linescan sensor only. In this embodiment on-head line scan sensor 64 and off-head linescan sensor 66 primarily provide essential placement information, although it is clear that both cameras could also provide inspection information if needed.

Figure 4:
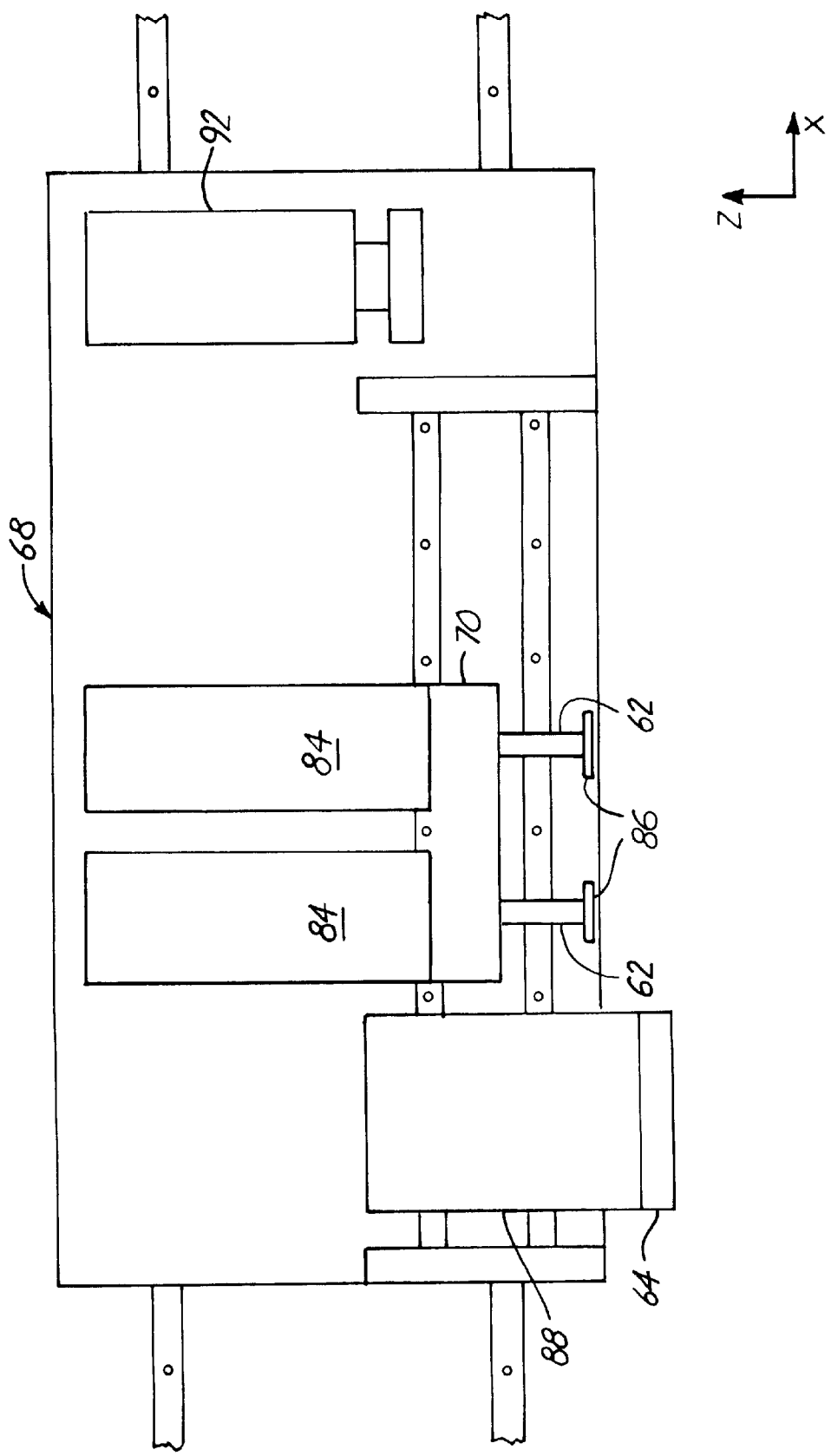
FIG. 4 is a side elevation view of a placement head in accordance with another embodiment of the present invention.

FIG. 4 is a side elevation view of a placement head in accordance with another embodiment of the present invention. FIG. 4 illustrates placement head 68 which is similar to placement head 58, and like components are numbers similarly. Placement head 68 differs from placement head 58 in that shadowing sensor 70 is disposed on placement head 68. The term "shadow sensor" is used to refer to any optical sensor (laser or otherwise) which views the side of a component while the component turns, to determine a dimension of the component. In particular, it is understood that an optical sensor which images the shadow of a component onto a detector while the component turns is also considered a shadowing sensor. LaserAlign® sensors are a preferred form of shadow sensors, and are produced by CyberOptics Corporation in Minneapolis, the present assignee, although other companies manufacture a somewhat similar shadowing sensor. Examples of such a sensor are set forth in U. S. Pat. No. 5,278,634 to Skunes et al., entitled HIGH PRECISION COMPONENT ALIGNMENT SENSOR SYSTEM, assigned to the assignee of the instant application and also in U.S. Pat. No. 5,559,278 to Deley, assigned to Quad Corporation.

A dual sensor pick-and-place machine having a combination on-head linescan sensor 64 and on-head shadow sensor 70 provides a number of advantages. For example, system throughput can be increased dramatically, in that in this embodiment each nozzle 62 has its own shadow sensor mounted thereon. Shadowing sensors capable of measuring multiple nozzles simultaneously could also be used. System throughput is improved because the shadowing sensor is capable of computing required orientation for small regularly-shaped components very quickly compared to a linescan camera. For the maximum throughput, this dual sensor system loads all nozzles on placement head 68 with only small, regularly-shaped components and computes their orientation with the shadow sensor(s) during travel to the placement site. When complex components such as flip-chips and BGAs need to be placed, then the on-head linescan sensor measures the orientation of such parts during travel to the placement site. If a mix of differently-sized components were loaded onto nozzles 62, then either the shadowing sensor(s) 70 or the on-head linescan sensor 64 measures the small, regularly-shaped components, but in any event the complex components are measured with the on-head linescan sensor. "Measured", as used in this application includes the process of determining the required re-orientation of the component in θ, x, and y directions in order to orient the component in its desired placement orientation. In this embodiment, both the shadow sensor(s) and the linescan sensor provide essential placement information, although they could also provide inspection information as needed.

Figure 5:
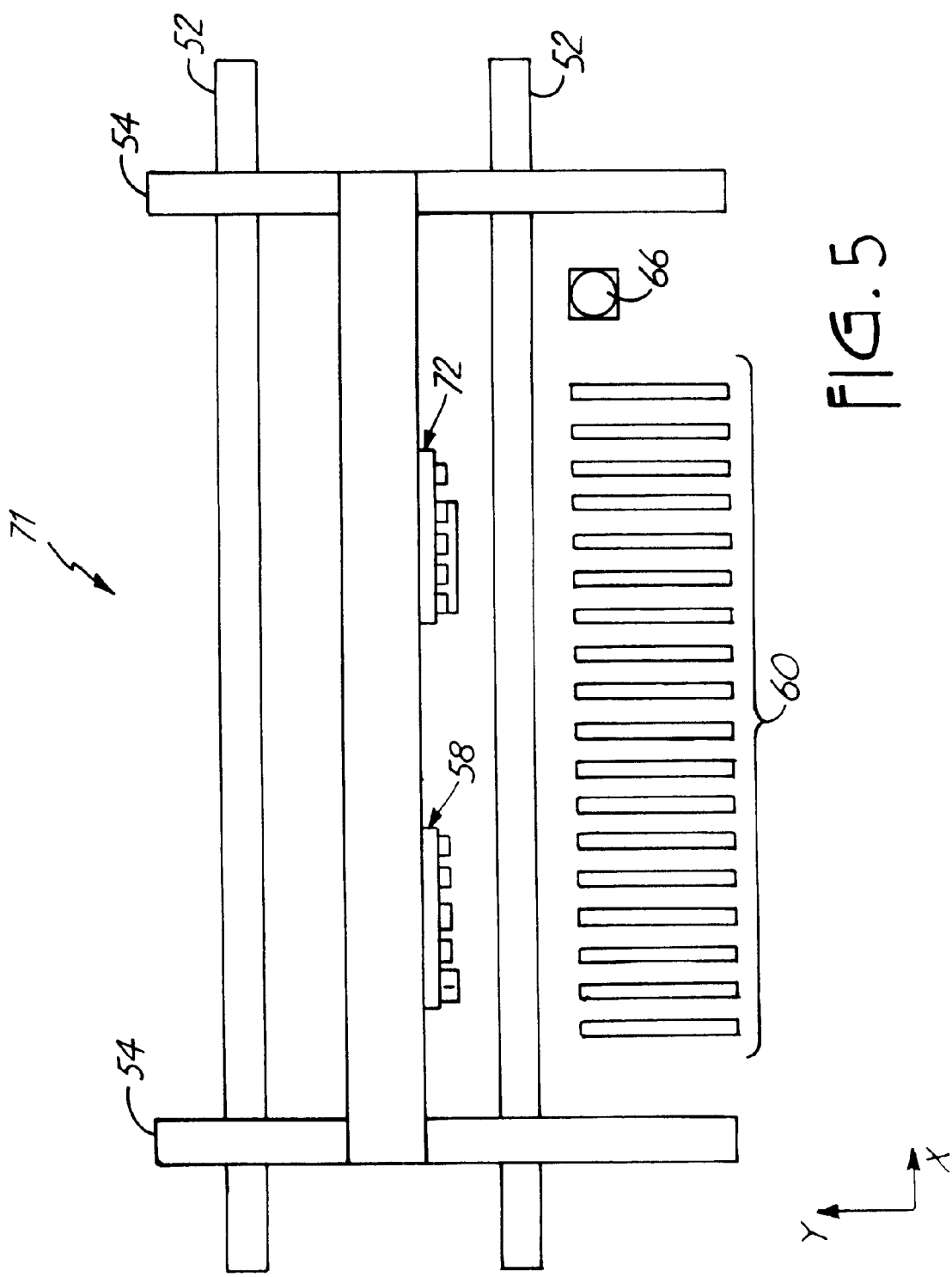
FIG. 5 is a top plan view of a pick and place machine in accordance with another embodiment of the present invention.

FIG. 5 is a top plan view of multi-placement head pick and place machine 71 in accordance with an embodiment of the present invention. Pick and place machine 71 includes a plurality of placement heads 58, 72. Placement head 58 is substantially identical to that described with respect to pick and place machine 50 (shown in FIG. 1). Placement head 72 differs from placement head 58 in that it includes a shadow sensor instead of an on-head linescan sensor. Thus, one or more placement heads, such as head 72, incorporate shadow sensors for high speed placement of small, regularly-shaped components. Other placements heads, such as head 58, use on-head linescan sensors for placing complex parts. The number of nozzles for these different placement heads is chosen such that it takes about the same amount of time to place the components picked-up by each head, on average. This arrangement ensures that each placement head is utilized to its fullest capacity. Whenever an on-head linescan sensor is used with another type of on-head sensor, both such sensors could be disposed on different placement heads in a multi-head pick and place machine, as described above.

Figure 6:
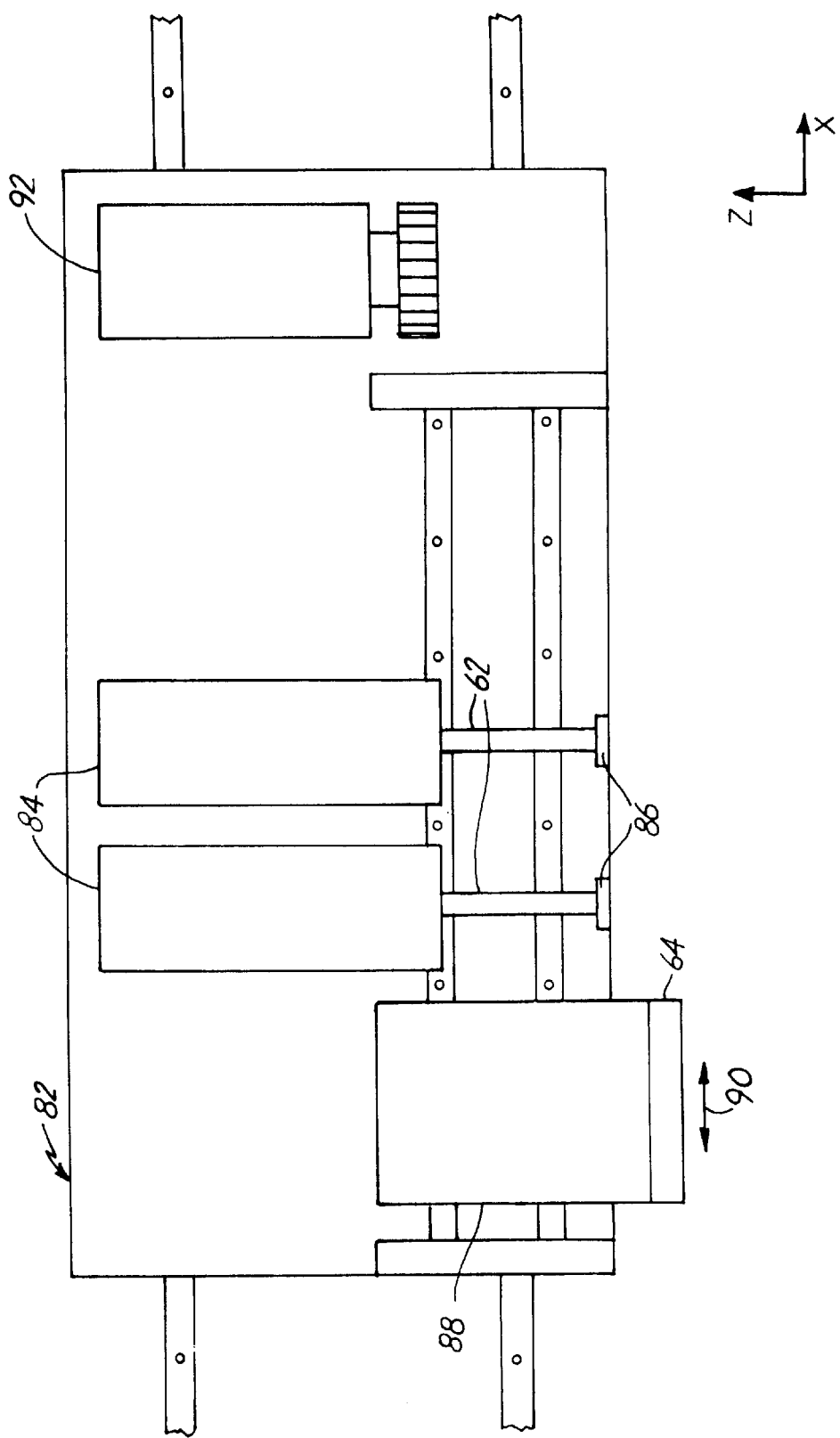
FIG. 6 is a side elevation view of a placement head in accordance with another embodiment of the present invention.
Figure 7:
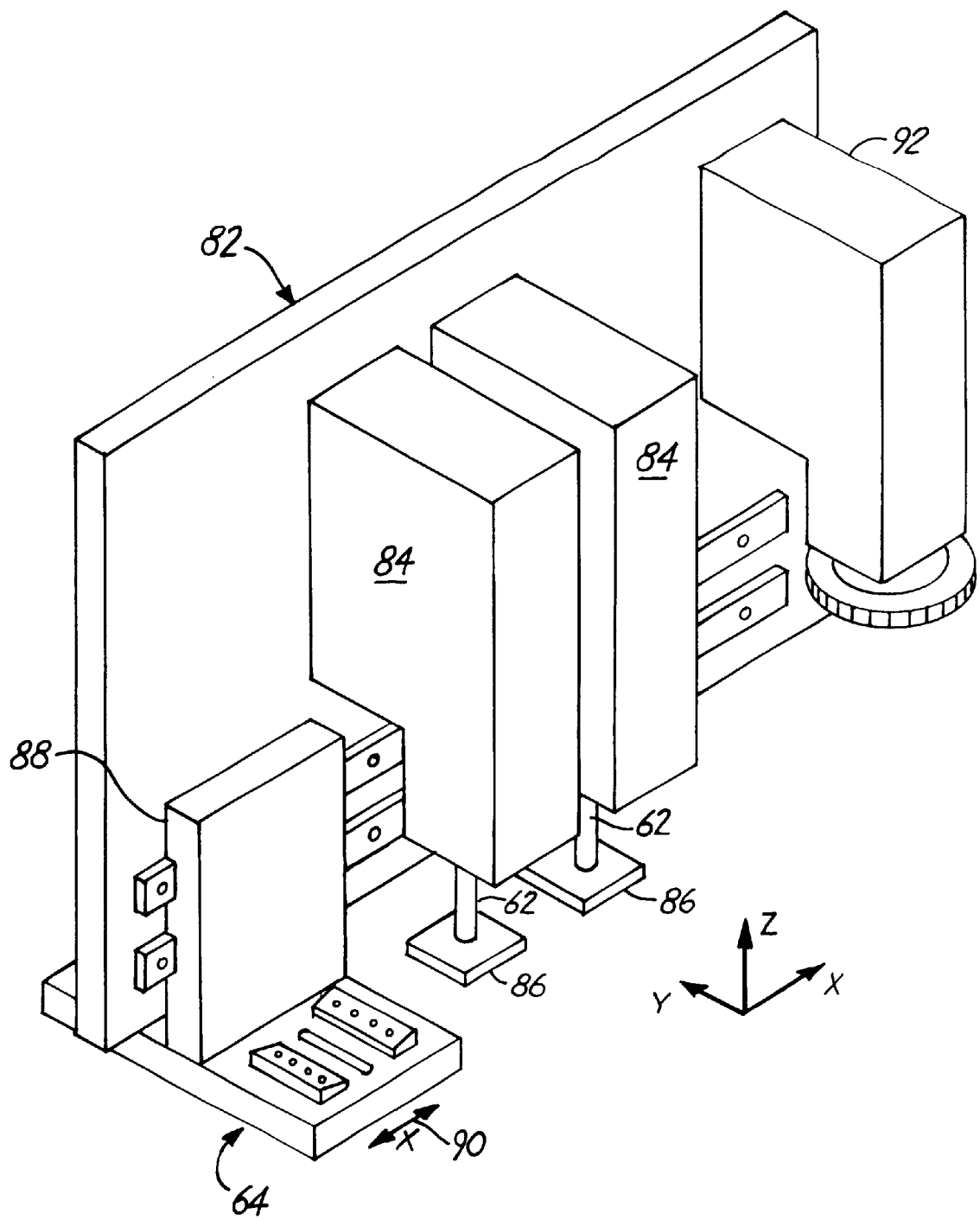
FIG. 7 is a perspective view of a placement head in accordance with the embodiment shown in FIG. 6.

FIGS. 6 and 7 are side elevation and perspective views, respectively, of a placement head in accordance with another embodiment of the present invention. Placement head 82 includes nozzles 62 which are coupled to pickup units 84 such that components 86 held by nozzles 62 can be translated (or moved) up and down and rotated about the nozzle axis. FIGS. 6 and 7 illustrate linescan sensor 64 movably supported upon linear stage 88, such that linescan sensor 64 moves in the X direction (the "scan direction") as indicated by arrow 90. Placement head 82 differs from placement head 58 shown earlier in that the placement head 82 includes fiducial camera 92.

Placement uncertainty arises not only from component orientation, but also from the exact location of the placement site on the workpiece. Although the on-head linescan sensor can provide component orientation information to reduce or eliminate the uncertainty of component orientation, some uncertainty will still exist due to the unknown exact location of the placement site. Many factors contribute to the uncertainty of the placement site location. One example is the loose mechanical tolerances of the workpiece location as it is held by conveyor 52. Another factor is due to the fact that, in some cases, the workpiece can be slightly stretched or warped.

In response to this concern, fiducial camera 92 measures registration marks, or fiducials, on the workpiece. The locations of the fiducials are used in order to compute the placement location correction. The placement location correction is then used in combination with the component offset correction computed by the linescan sensor to accurately place the component. In this embodiment, fiducial camera 92 is the additional optical sensor. Camera 92 provides essential placement information, since it establishes a physical coordinate system for the overall PC board, and can also be used to provide a more precise, local coordinate system for a small portion of the board.

As can be appreciated by those skilled in the art, any combination of additional optical sensors can be used in combination with the on-head linescan sensor for embodiments of the present invention. For example, FIG. 4 illustrates an on-head linescan sensor in combination with shadow sensor 70, and a fiducial camera, which is not discussed with respect to FIG. 4. Another example is that the embodiment shown in FIGS. 6 and 7 could be made with an off-head fiducial camera. Thus, embodiments including an on-head linescan sensor and one or more additional optical sensors, of like or different types, are expressly contemplated.

Figure 8:
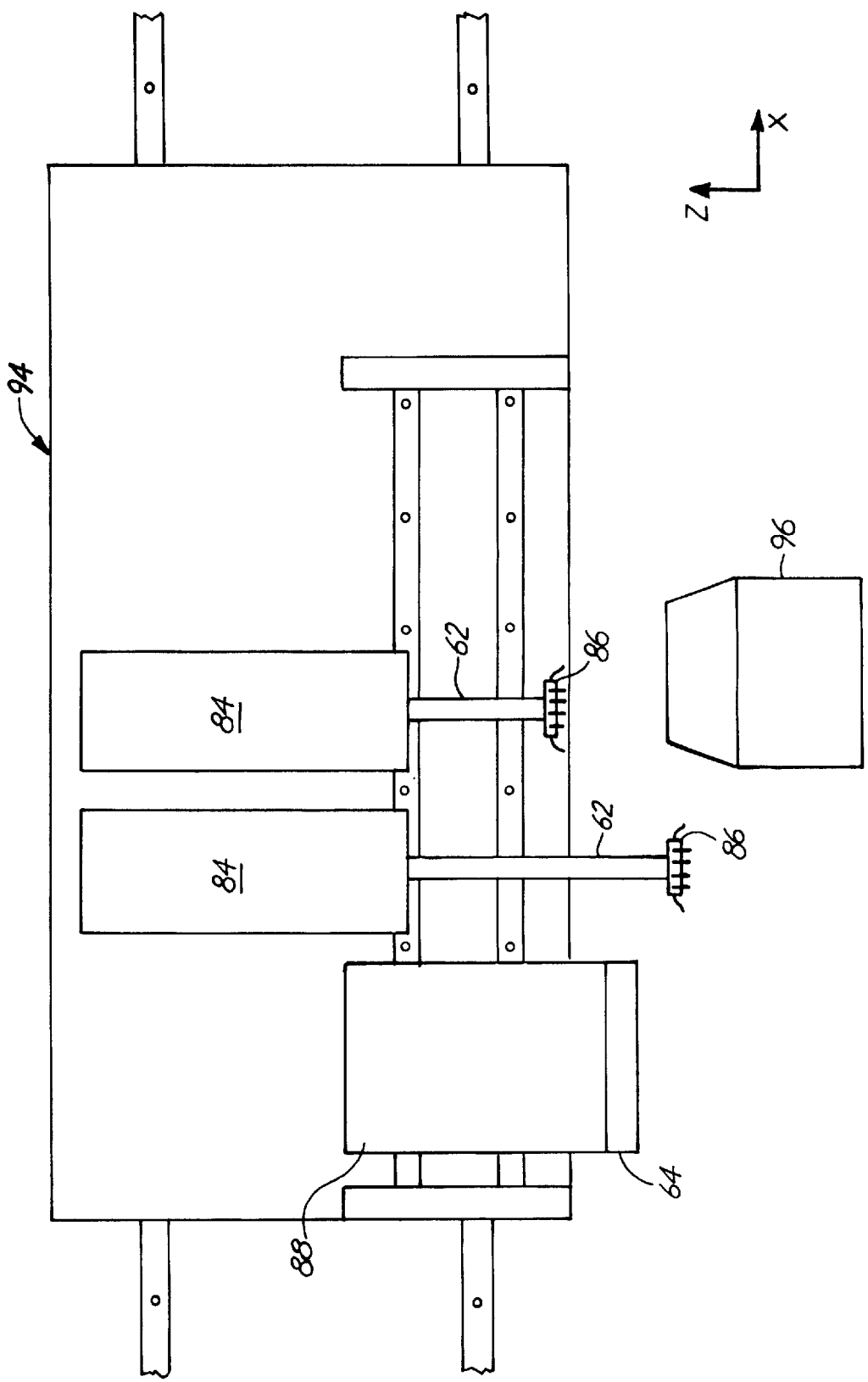
FIG. 8 is a side elevation view of a portion of a pick and place machine in accordance with an embodiment of the present invention.

FIG. 8 is a side elevation view of a portion of a pick and place machine in accordance with another embodiment of the present invention. Placement head 94 bears a number of similarities to placement head 82 (shown in FIG. 7) and like components are numbered the same. The portion of the pick and place machine illustrated in FIG. 8 differs from previous embodiments due to the addition of off-head coplanarity sensor 96. Off-head coplanarity sensor 96 can be any suitable off-head sensor that provides coplanarity information. One example of an off-head coplanarity sensor is provided in U.S. Pat. No. 5,331,406 to Fishbaine et al., entitled MULTI-BEAM LASER SENSOR FOR SEMICONDUCTOR LEAD MEASUREMENTS, assigned to the same assignee as the present application. Known laser triangulation systems can also be used for off-head coplanarity sensor 96. Alternatively, coplanarity sensor 96 can be a rotary camera as disclosed in co-pending U.S. patent application Ser. No. 09/314,169, filed May 19, 1999, entitled ROTARY SENSOR WITH SINGLE DETECTOR and U.S. Pat. No. 6,292,261 to Fishbaine et al., entitled ROTARY SENSOR WITH AT LEAST TWO DETECTORS both owned by the present assignee.

As can be appreciated, a pick and place machine employing both an on-head linescan sensor, and an off-head coplanarity sensor has a number of advantages. First, for components where coplanarity is unimportant, placement can be effected without reference to the coplanarity sensor, and thus at high speed. Additionally, when coplanarity is important, such as during inspection steps, the component can be transported to the coplanarity inspection location. In this embodiment, coplanarity sensor 96 provides inspection information, and in some embodiments thereof, may also provide placement information.

Figure 9:
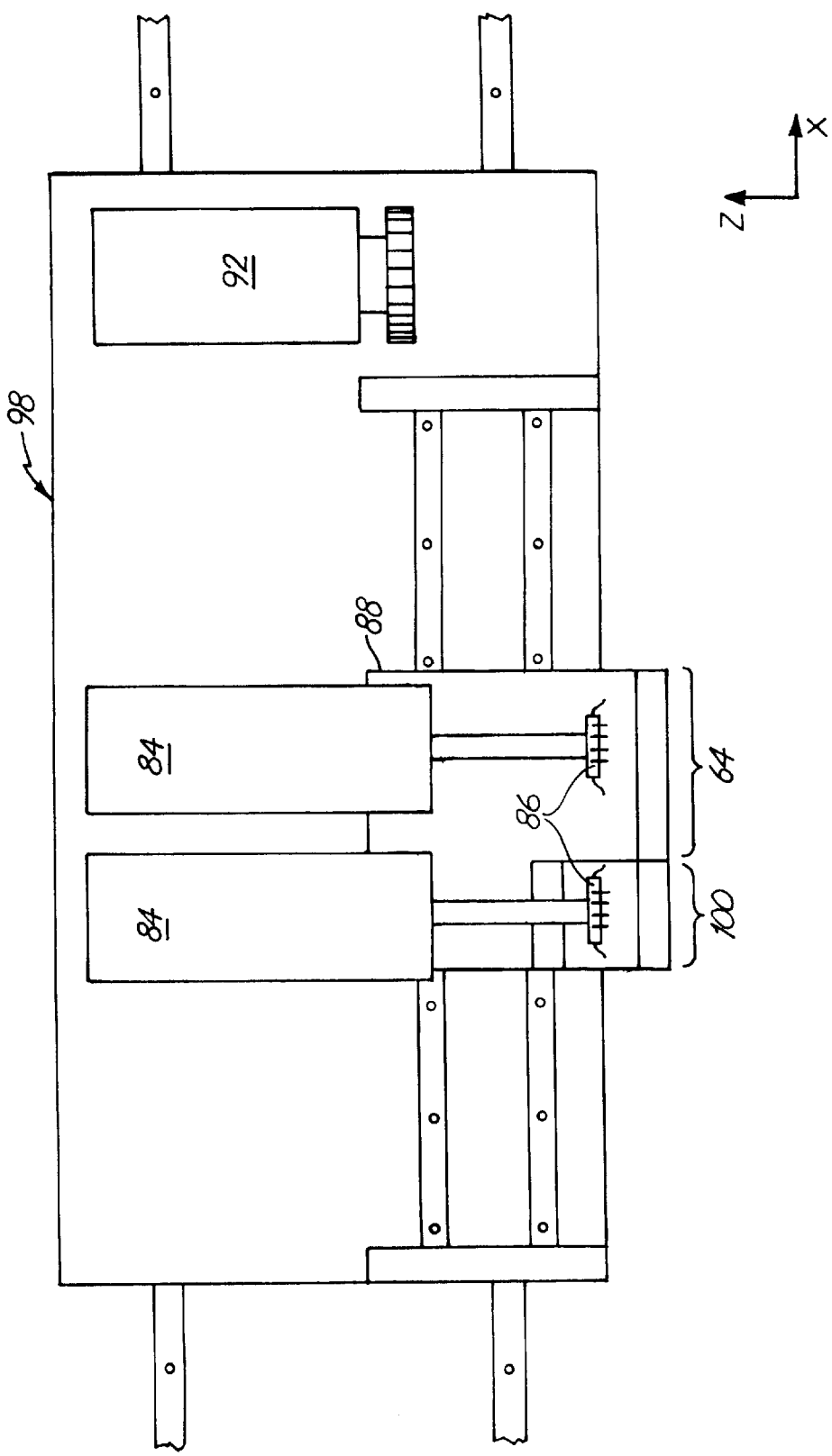
FIG. 9 is a side elevation view of a placement head in accordance with an embodiment of the present invention.

FIG. 9 is a side elevation view of a portion of a pick and place machine in accordance with another embodiment of the present invention. The portion of the pick and place machine illustrated in FIG. 9 is similar to that of FIG. 8, except that coplanarity sensor 100 is disposed on placement head 98. Such configuration provides all of the advantages listed above with respect to off-head coplanarity sensor 96. However, placement head 98 provides the additional advantage that coplanarity measurement can be performed while placement head 98 is transporting one or more components to their respective placement sites. One type of sensor that is particularly well-suited for on-head coplanarity sensing is known as a rotary scan camera. An example of a rotary scan camera is provided in co-pending U.S. patent application Ser. No. 09/314,169, filed May 19, 1999 and entitled ROTARY SENSOR SYSTEM WITH SINGLE DETECTOR and Ser. No. 09/314,545, filed May 19, 1999 and entitled ROTARY SENSOR SYSTEM WITH AT LEAST TWO DETECTORS, both owned by present assignee.

Although the present invention has been described with reference to preferred embodiments, workers skilled in the art will recognize that changes may be made in form and detail without departing from the spirit and scope of the invention. In particular, the pick-and-place machine of the present invention includes the use of any type of on-head linescan sensor with another type of on-head or off-head optical sensor, where the linescan sensor is adapted to provide component information and the additional optical sensor provides essential placement information, in the form of orientation or inspection information.

What is claimed is:

1. A pick and place machine, comprising:

a head having at least one nozzle for releasably holding a component, the nozzle having a nozzle axis, the head adapted to place the component on a workpiece;

a linescan sensor mounted on the head, and adapted to move relative to the component to image the component and provide at least one component data, the linescan sensor having a line of sight substantially parallel to the nozzle axis;

at least one additional optical sensor disposed to provide placement information; and a controller coupled to the head, the linescan sensor, and the at least one additional optical sensor, wherein the controller receives the component data and the placement information to cause the head to place the component.

2. The machine of claim 1, wherein the at least one additional optical sensor includes a plurality of optical sensors.

3. The machine of claim 1, wherein the at least one additional optical sensor is disposed on the head.

4. The machine of claim 3, wherein the at least one additional optical sensor includes a first shadow sensor.

5. The machine of claim 4, where a second shadow sensor is mounted on the head.

6. The machine of claim 3, wherein the at least one additional optical sensor is a fiducial camera.

7. The machine of claim 3, wherein the at least one additional sensor is a coplanarity sensor.

8. The machine of claim 1, wherein the at least one additional optical sensor is not disposed on the head.

9. The machine of claim 8, wherein the at least one additional optical sensor is a fixed linescan sensor.

10. The machine of claim 8, wherein the at least one additional optical sensor is a 2-D camera.

11. The machine of claim 8, wherein the at least one additional optical sensor is a fixed coplanarity sensor.

12. The machine of claim 1, and further comprising a second head having at least one nozzle for releasably holding at least one additional component, the second head adapted to place the at least one additional component on the workpiece.

13. The machine of claim 12, wherein the additional optical sensor is mounted on the second head.

14. A method of placing at least two components with a pick-and-place machine, the method comprising:

picking the at least two components with a placement head;

imaging one of the components with a linescan sensor mounted to the placement head;

acquiring placement information related to the other of the components from an additional optical sensor; and placing the components based at least in part upon the linescan image and the placement information.

15. The method of claim 14, wherein the placement information includes inspection information.

16. A method of placing a component with a pick-and-place machine, the method comprising:

picking up two components with a placement head;

imaging the two components with an on-head linescan sensor and an additional optical sensor, both sensors providing placement information about the two components; and placing the two components based on the placement information.

17. The method of claim 16, where one of the two components is picked up and an imaging thereof is commenced before the other of the two components is picked up.

18. A method of placing a component with a pick-and-place machine, the method comprising:

picking the component with a placement head;

imaging the component with a linescan sensor mounted to the placement head;

acquiring placement information related to the component from a fiducial camera; and placing the component based at least in part upon the linescan image and the placement information from the fiducial camera.

* * * * *